United States Patent
Anderson et al.

(10) Patent No.: US 9,583,489 B1
(45) Date of Patent: Feb. 28, 2017

(54) SOLID STATE DIFFUSION DOPING FOR BULK FINFET DEVICES

(71) Applicant: International Business Machines Corporation, Armonk, NY (US)

(72) Inventors: Brent A. Anderson, Jericho, VT (US); Hemanth Jagannathan, Niskayuna, NY (US); Sanjay C. Mehta, Niskayuna, NY (US); Balasubramanian Pranatharthiharan, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/991,417

(22) Filed: Jan. 8, 2016

(51) Int. Cl.
| | |
|---|---|
| *H01L 27/092* | (2006.01) |
| *H01L 21/8238* | (2006.01) |
| *H01L 29/66* | (2006.01) |
| *H01L 29/06* | (2006.01) |

(52) U.S. Cl.
CPC .. *H01L 27/0921* (2013.01); *H01L 21/823807* (2013.01); *H01L 21/823821* (2013.01); *H01L 27/0924* (2013.01); *H01L 29/0638* (2013.01); *H01L 29/66537* (2013.01)

(58) Field of Classification Search
CPC ......... H01L 27/0921; H01L 21/823821; H01L 27/0924; H01L 29/0638; H01L 21/823807; H01L 29/66537

See application file for complete search history.

(56) References Cited

U.S. PATENT DOCUMENTS

| | | | |
|---|---|---|---|
| 5,605,861 | A | 2/1997 | Appel |
| 5,969,382 | A | 10/1999 | Schlais et al. |
| 6,174,767 | B1 | 1/2001 | Chi |
| 6,461,981 | B1 | 10/2002 | Chang |
| 6,534,351 | B2 | 3/2003 | Muller et al. |
| 7,928,000 | B2 | 4/2011 | Kang et al. |
| 8,679,958 | B2 | 3/2014 | Takamure et al. |
| 8,853,008 | B1 | 10/2014 | Lee |
| 2014/0264492 | A1 | 9/2014 | Lee |
| 2015/0243739 | A1* | 8/2015 | Chen ................... H01L 29/7851 257/623 |

FOREIGN PATENT DOCUMENTS

| | | |
|---|---|---|
| CN | 1228199 A | 9/1999 |
| WO | 2014070600 A1 | 5/2014 |

* cited by examiner

*Primary Examiner* — Roy Potter
*Assistant Examiner* — Paul Patton
(74) *Attorney, Agent, or Firm* — Cantor Colburn LLP; Bryan Bortnick

(57) ABSTRACT

A method of forming a semiconductor device comprises forming a first fin on a substrate, depositing an insulator layer on the substrate adjacent to the first fin, removing a first portion of the insulator layer to expose a first portion of a sidewall of the first fin, depositing a layer of spacer material over the first portion of the sidewall of the first fin, removing a second portion of the insulator layer to expose a second portion of the sidewall of the first fin, depositing a first glass layer including a first doping agent over the exposed second portion of the sidewall of the first fin, and performing a first annealing process to drive the first doping agent into the first fin.

17 Claims, 17 Drawing Sheets

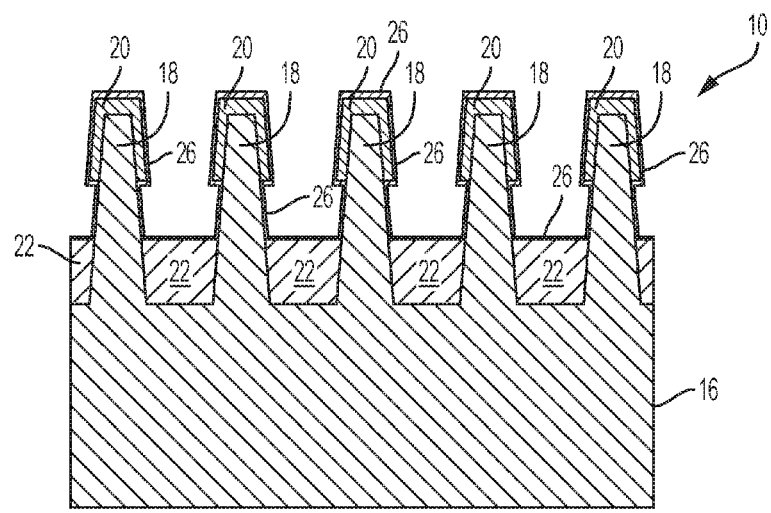
FIG. 3
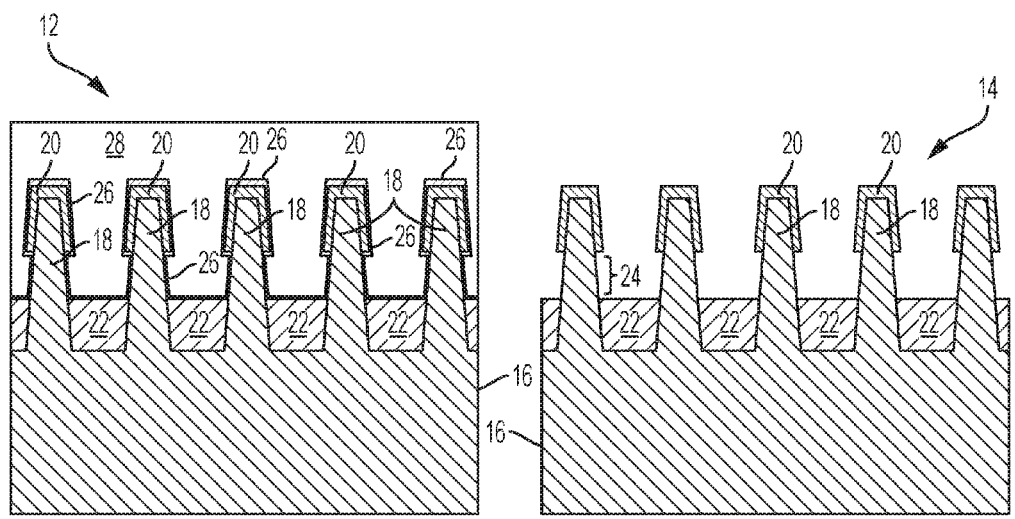
FIG. 4A
FIG. 4B

SOLID STATE DIFFUSION DOPING FOR BULK FINFET DEVICES

BACKGROUND

The present invention relates to semiconductor devices, and more specifically, fin-like field effect transistors (Fin-FET).

Fin field effect transistors (finFETs) have been extensively investigated as one of the future device options for continued scaling of complementary metal oxide semiconductor (CMOS) technology. Most CMOS applications require various types of devices on the same chip. For example, a microprocessor chip usually includes both n-type and p-type (nFETs and pFETs) devices with various threshold voltages. The finFET devices have undoped channel to take advantage of the improved Device Electrostatics. The Vt tuning in finFET devices is achieved by the smart choice of Work Function Metals during the Gate Stack Patterning.

Accordingly, it is desirable to provide integrated circuits and methods for fabricating integrated circuits having fin-FETs with improved junction (aka Punch Through Stopper (PTS) Junction) beneath active channel regions to prevent sub-fin leakage in the bulk finFET devices.

SUMMARY

According to an embodiment of the present invention, a method of forming a semiconductor device comprises forming a first fin on a substrate, depositing an insulator layer on the substrate adjacent to the first fin, removing a first portion of the insulator layer to expose a first portion of a sidewall of the first fin, depositing a layer of spacer material over the first portion of the sidewall of the first fin, removing a second portion of the insulator layer to expose a second portion of the sidewall of the first fin, depositing a first glass layer including a first doping agent over the exposed second portion of the sidewall of the first fin, and performing a first annealing process to drive the first doping agent into the first fin.

According to another embodiment of the present invention, a method of forming a semiconductor device comprises forming a first fin on a substrate, depositing an insulator layer on the substrate adjacent to the first fin, depositing a layer of spacer material over a first portion of a sidewall of the first fin, removing a first portion of the insulator layer to expose a second portion of a sidewall of the first fin, depositing a first glass layer including a first doping agent over the insulator layer and the exposed second portion of the sidewall of the first fin, and performing an annealing process to drive the first doping agent into the first fin.

According to another embodiment of the present invention, a semiconductor device comprises a first semiconductor fin arranged on a substrate, an insulator layer arranged on the substrate adjacent to the first semiconductor fin, and a first gate stack arranged over a channel region of the first semiconductor fin, a first glass layer arranged on the insulator layer adjacent to the first semiconductor fin.

BRIEF DESCRIPTION OF THE DRAWINGS

FIGS. 1 through 13B illustrate an exemplary fabrication process of forming a semiconductor device according to an embodiment, in which:

FIG. 1 is a cross-sectional view illustrating the first and/or second portion including a STI dielectric layer between FINS, capped top and forming sidewall spacer portions protecting the active FIN surfaces according to an embodiment;

FIG. 2 is a cross-sectional view of the first and/or second portion illustrating further recessing the STI Oxide dielectric layer to expose a sub-fin region for forming a doped region (PTS junction) under each of the capped fins according to an embodiment;

FIG. 3 is a cross-sectional view of the first and/or second portion illustrating depositing of a first conformal doped glass layer according to an embodiment;

FIG. 4A is a cross-sectional view of the first portion illustrating blocking the fins on the first portion according to an embodiment;

FIG. 4B is a cross-sectional view of the second portion illustrating the removal of the first doped glass layer from the second portion according to an embodiment;

FIG. 5 is a cross-sectional view of the first portion illustrating removal of the first blocking agent and annealing of the first doped glass layer to drive dopant in the exposed sub-fin region in first type of device according to an embodiment;

FIG. 6 is a cross-sectional view of the first portion illustrating removal of residual doped glass layer.

FIG. 8 is a cross-sectional view of the first portion illustrating removal of the second glass layer from the first portion according to an embodiment;

FIG. 9 is a cross-sectional view where blocking layer is removed and annealing to drive in second dopant the sub-fin region of the second device;

FIG. 13B is a cross-sectional view of the second portion illustrating the removal of the masked layer(s) of the fins according to an embodiment.

FIGS. 14A through 18B illustrate an exemplary fabrication process of forming a semiconductor device according to another embodiment, in which:

FIG. 14A is a cross-sectional view illustrating the first and/or second portion including a dielectric layer and capped top portions of the fins according to an embodiment;

FIG. 18B is a cross-sectional view of the second portion illustrating annealing the second glass layer according to an embodiment;

FIGS. 20A through 22B illustrate an exemplary fabrication process of forming a semiconductor device according to yet another embodiment, in which:

FIG. 20A is a cross-sectional view of the first portion post-sub-fin doping illustrating removal of the dielectric layer between the fins is completely removed post-drive in anneal according to an embodiment.

FIG. 22B is a cross-sectional view of the second portion where a new dielectric layer is recessed to expose the capped portion of the FIN and cap removed according to an embodiment.

DETAILED DESCRIPTION

Figure 1:
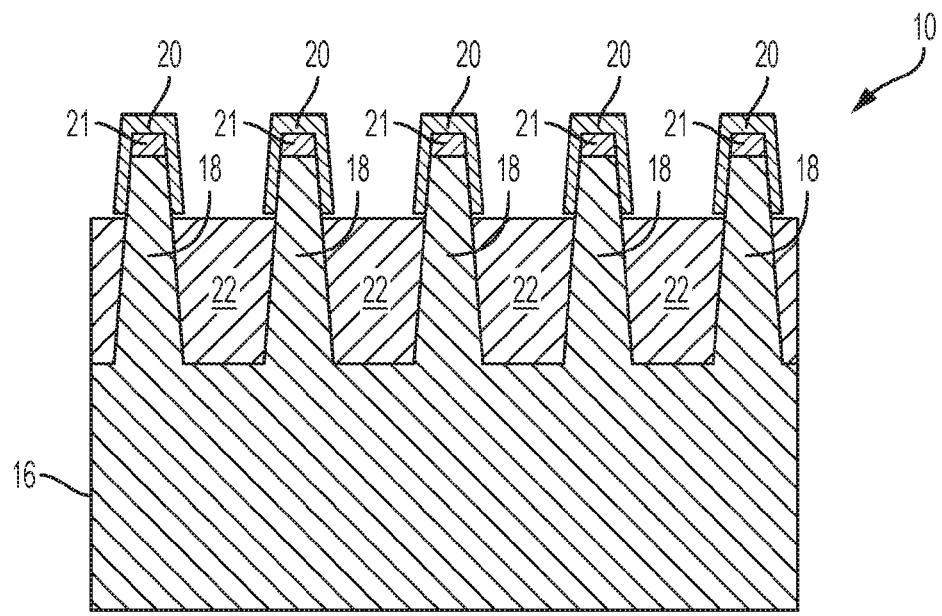

The exemplary embodiments of this invention are described below in the context of a FinFET.

SOI based finFET devices are separated from the Si substrate by a thick insulating $SiO_2$ (BOX) layer. However, in the case of bulk finFET, active channel (fin) is in direct contact w/ the substrate. This provides a direct run path for leakage from active fin to the substrate, causing sub-FIN leakage, also known as Punch-Through Leakage even when the device is in the OFF state. In order to prevent this sub-fin leakage, dopant of opposite polarity is just beneath the active FIN region to form a junction at the active Fin/sub-fin boundary. Thus, pFIN device requires n-type dopant, whereas nFIN device requires p-type dopant. The desired doping levels are in the range of $1E18/cm^2$ to $5E18/cm^2$.

A conventional doping method includes angled ion implantation to dope a portion of the fins. Angled ion implantation includes bombarding the fin with dopants, such as, phosphorus, arsenic or antimony for nFETs or boron or indium for pFETs. Other surfaces can be exposed or protected from the bombardment to ensure that dopant density and type are appropriate. However, the use of high energy bombardment of ions can result in significant damage to the thin silicon-based fin layer, such as introducing planar defects in the silicon lattice, and possibly causing local amorphization. Physical lattice damage from the high energy ion implantation can lead to transient effects such as enhanced diffusion during activation anneal, thereby compromising the quality of the junction. In addition, the lattice damage can lead to mobile defects that can potentially migrate into the fin region, thereby adversely impacting the transport characteristics of the device. Further, doping by ion implantation is not feasibly scalable or extendible with the fin pitch due to increased shadowing effects resulting in implant dose loss and non-uniform dopant distribution below the fin.

In addition, ion implant methods require the active FIN regions to remain protected during the implant to keep the active channel undoped. This approach is not easily scalable due to shadowing effects from the tall fin geometries. As a result, sub-fin doping is non-uniform, and could lead to inaccurate positioning of the dopants. Further, ion implant based approaches could lead to undesirable lattice defects below the fin that could adversely impact the device operation. Other method includes early implant, where graded doping of required polarity type is achieved via Ion Implantation in the sub-fin region prior to growing EPI using mask. FIN patterning is done after growing un-doped EPI right above the implanted substrate. Generally, these methods require masking one portion of a semiconductor wafer, performing a doping technique or other process, removing the mask, forming a new mask on another portion of the wafer followed by performing a different doping technique or other process and removing the new mask. The masking and doping processes have to be performed accurately to ensure proper operation of devices. The drawback of this approach is that the defects in the implanted substrate may impact the quality of EPI which would define the active channel region.

The methods disclosed herein result in the formation of a Bulk FinFET including a pFET portion and an nFET portion. Bulk FIN structures are directly connected to the substrate. As a result, sub-fin leakage would essentially render these devices very leaky (high $Is_{off}$ @ constant $V_{tsat}$). In order to reduce the sub-fin leakage, a junction is formed just beneath the un-doped FIN (channel) by introducing and activating dopants. The resulting FinFET device has low sub-fin leakage ($Is_{off}$) by-providing direct and controlled doping in the sub-fin regions of the active FIN device.

The disclosed methods for solid phase doping of sub-fin region involves first forming a protective cap layer around the active channel (fin) region, depositing a conformal oxide layer containing dopant of singular polarity, removing the conformal doped oxide layer from the second type of devices where dopant of first type is not desired, while preserving on those devices where such dopant is desired, and thermally annealing to diffuse dopant atoms to desired locations in the in the sub-fin regions of the first type of the device. Similarly, doped oxide of opposite polarity from the first type is next deposited conformally on all devices, followed by removal of these oxides from the first type of devices where dopant of second type (or polarity) is not desired, while preserving the film on the devices of the second type, and finally, thermally annealing to diffuse dopant atoms of the second type to the desired locations in the sub-fin regions of the second type of device. Solid state doping methods are advantageous over convention methods such as angled ion implantation of the dopants post-fin formation. The conventional angled ion implantation approach results in less precise placement of the dopants due to shadowing from the surrounding tall fin structures. Additionally, Ion implantation has the potential to induce crystal defects such as dislocations, stacking faults, and in extreme cases amorphization in the thin sub-fin regions directly under the active undoped channel of the device. The end of range defects resulting from Ion Implantation may cause such transient effects such as enhanced upward diffusion of dopants into the active channel, compromising the electrostatics benefit from the fully depleted finFET devices. The Solid State Doping does not cause these end of range crystal defects. Further, the methods disclosed herein have CMOS compatibility by providing two distinct sources of dopants (p-type and n-type) in SiO2 films separately for nFET and pFET portion of the device.

FIGS. 1 through 13B illustrate an exemplary fabrication process of forming a semiconductor device 10 according to an embodiment. FIGS. 14 through 19B illustrate an exemplary fabrication process of forming a semiconductor device 10 according to another embodiment. Whereas FIGS. 20A through 22B illustrate an exemplary fabrication of forming a semiconductor device 10 according to yet another embodiment. It should be understood that the disclosure is not limited to the three embodiments described herein. Several variations of the embodiments are contemplated and disclosed herein.

Figure 2:
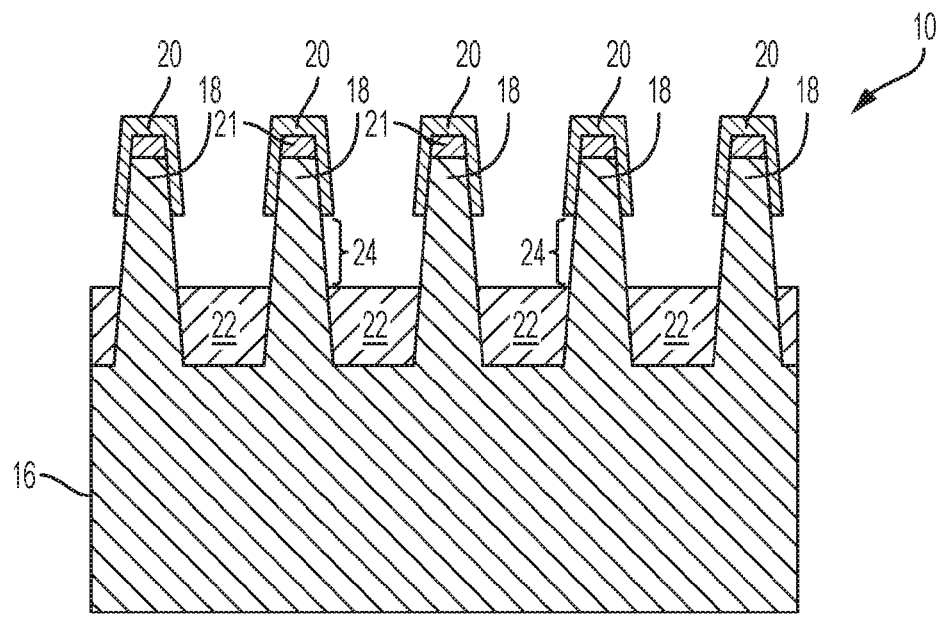

In an example, the disclosed method results in a semiconductor device 10 wherein the first portion 12 can become a pFET and the second section 14 can become an nFET, or vice versa. FIGS. 1-3 are a cross-sectional view illustrating a first portion 12 and/or second portion 14 of the device 10. In other words, FIGS. 1-3 illustrate the first three steps of the method that can be applied to both the first portion 12 and second portion 14, optionally simultaneously. The first portion 12 and second portion 14 include a substrate 16. The substrate 16 is a bulk silicon substrate. However, the substrate 16 is not limited to Si substrate, and could also be III-V materials such as InGaAs, InAlAs, etc., or a combination of elements from group IV of periodic table such as $Si_{1-x}Ge_x$ where $0 \leq x \leq 50$.

The substrate 16 includes at least one fin 18 extending from the substrate 16. The fins 18 can be fabricated on the substrate 16 in any suitable manner. For example, the fins 18 can be epitaxially grown on the substrate 16 prior to FIN patterning, or etched from the substrate 16. The top portions of the fins 18 can be capped with a masking layer 21, such as silicon nitride layer. The capping layer 20 can be an Oxide/Nitride bilayer, which cover a top surface and/or sidewalls of the active fin surface 18. This sidewall capping layer 20 serves to prevent dopant diffusion into the FIN (which becomes an active channel of the device)

The substrate includes a first dielectric layer 22. The dielectric layer 22 serves as a Shallow Trench isolation layer of silicon oxide. The Gap Fill dielectric layer 22 can be deposited by any of the known CVD processes such as HARP, HDP or Flowable CVD. The dielectric layer 20 is a capping layer on top of FIN. Capping Layer 20 can be SiN. Post-deposition, the Dielectric layer 22 is planarized by CMP to stop on top of the capping layer 20, and then recessed uniformly and selectively to layer 20, using anisotropic Etching (RIE) or isotropic wet (DHF, BHF) or dry etch processes such as SICONI or COR to reveal the active portion of the fin shown by the layer 18. The height of revealed portion of the Fin may range from 20 nm to 60 nm. The active channel (FIN) layer 18 is then protected by the dielectric layer 20. The dielectric layer 20 can include a bilayer comprising silicon oxide and silicon nitride. Dielectric layer is then anisotropically etched using Reactive Ion Etching, stopping on recessed dielectric layer 22 to form a bilayer spacer protecting the active channel region from undesired doping.

FIG. 2 is a cross-sectional view of the first portion 12 and/or second portion 14 illustrating recessing the dielectric layer 22 to expose a sub-fin region (aka punch through stopper (PTS) junction region) 24 under the capped fins 18. The selective removal of the dielectric layer 22 can be performed by reactive ion etching (RIE) or isotropic wet etching. In an example, the dielectric layer 22 is removed by timed anhydrous HF oxide etch, followed by an in situ rinse.

FIG. 3 is a cross-sectional view of the first portion 12 and/or second portion 14 illustrating depositing of a first glass layer 26 including a first doping agent. The first glass layer 26 can have a thickness of 10 Å to 100 Å. The dopant concentration in the oxide layer can range from $5e19/cm^3$ to $1e21/cm^3$. The first glass layer 26 may be formed using known deposition techniques, such as Thermal or Plasma Assisted Atomic Layer Deposition. The p type PTS dopant is needed for the nFET devices, whereas n-type PTS dopant is required for the pFET devices. In the disclosure, p and n doped glasses are deposited alternately to dope nFET and pFET sub-fin regions for PTS formation. Further, the description of p type and n type dopants is not limited to boron and phosphorus as used in the example above, but can be extended to include Al, Ga or In doped glass for p type doping or As, Sb doped glass for n type doping. The order of doping layer is not critical.

In the example of FIG. 3, the first glass layer 26 can be a glass layer containing n-type dopant Phosphosilicate Glass (PSG) wherein the first doping agent is Phosphorus. The PEALD deposition process used for the first glass layer 26 could be applied by alternate cycles of P containing precursor and Si precursors forming dopant oxide ($P_2O_5$) layer and $SiO_2$ layer respectively. The oxidation is achieved using remote or direct plasma $O_2$ in the chamber. The concentration of dopant in the oxide is tuned by controlling Dopant Oxide (P2O5) to $SiO_2$ cycle ratio. Phosphorus containing precursors include trimethyl phosphite (TMPI) or Tri-Ethyl Phosphate (TEPO), whereas Si containing precursor could be any of the BDEAS, BDMAS, BTBAS or Silane. The first glass layer 26 could also be a monolayer of diethyl 1-propylphosphonate, wherein the first doping agent is phosphorus. The first glass layer 26 can be an arsenic precursor wherein the first doping agent is arsenic.

FIG. 4A is a cross-sectional view of the first portion 12 illustrating blocking the fins 18 on the first portion 12 which in the example of FIG. 4A is nFET with a first blocking agent 28. In an example, the first blocking agent 28 can include a photoresist layer, or a combination of organic planarizing layer and photoresist layer. The first portion 12 (pFET fin device) is blocked in order to remove the first glass layer 26 from the second portion 14 (nFET device) without removing the first glass layer 26 (PSG) from the first portion 12 (pFET device). The first glass layer 26 is removed from the second portion 14 (nFET device) using isotropic WET Etch chemistries such as BHF or DHF. Alternately, dry isotropic etch processes such as SICONI or COR can be employed prior to annealing the first glass layer 26 on the first portion 12 so that the second portion is not doped with the first doping agent of the first glass layer 26.

FIG. 4B is a cross-sectional view of the second portion 14 illustrating the removal of the first glass layer 26 (PSG) from the second portion 14 (nFET device). Specifically, the first glass layer 26 can be removed from the surfaces of the masking layer 20, the PTS regions 24, and the dielectric layer 22.

Figure 5:
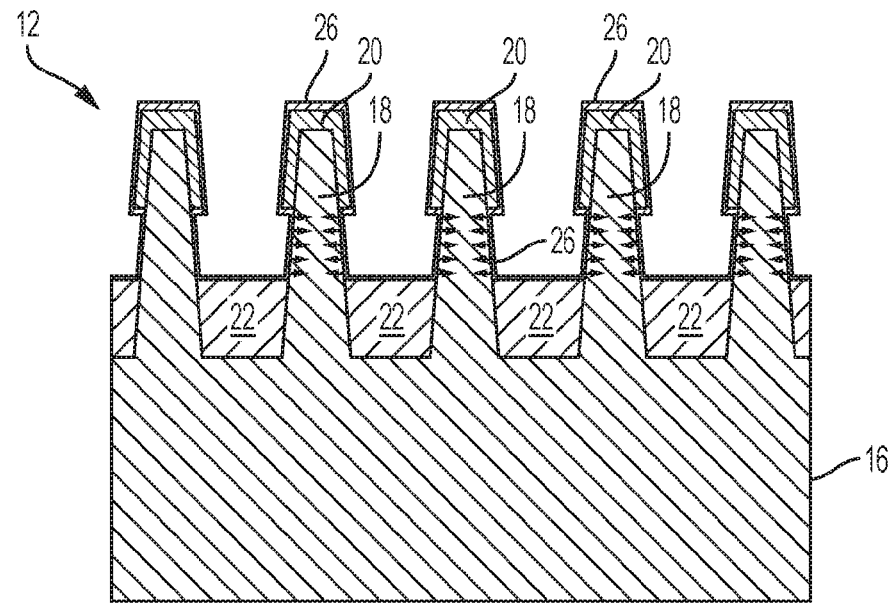

FIG. 5 is a cross-sectional view of the first portion 12 illustrating removal of the blocking agent 28 and annealing of the first glass layer 26, specifically doping the PTS junction regions 24 of the first portion 12 (pFET device) with the first doping agent (Phosphorus). The diffusion annealing steps disclosed herein may be performed with a standard soak or spike RTA in the temperature range of 800° C. to 1100° C., in nitrogen to drive dopants in. For the soak RTA, hold times could range from 1 second to 120 seconds (s).

Figure 6:
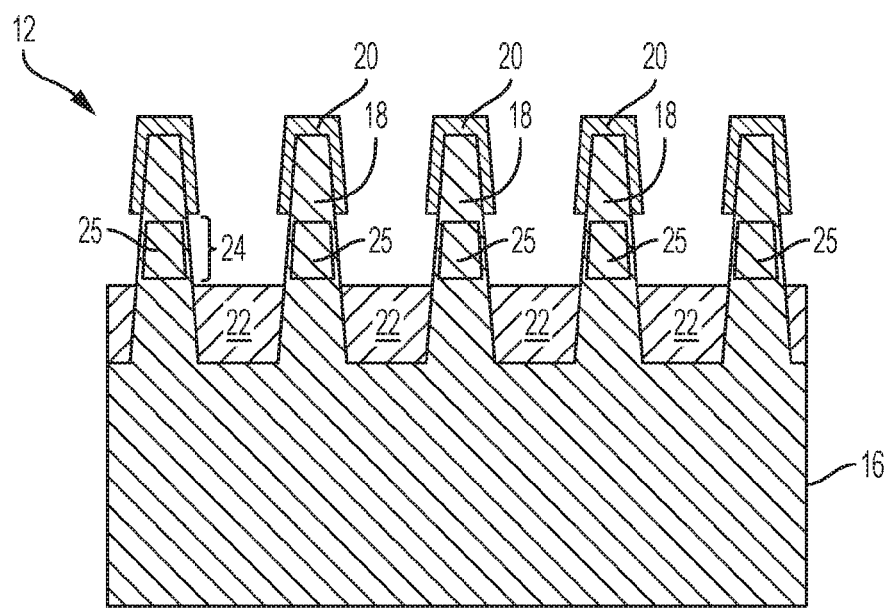

FIG. 6 is a cross-sectional view of the first portion 12 (pFET devices) illustrating removal of the residual first glass layer 26 (PSG) from the first portion 12 (pFET devices). Specifically, the first glass layer 26 can be removed from the surfaces of the masking layer 20, the PTS regions 24, and the dielectric layer 22. However, it is not necessary to remove the first glass layer 26. In an example, the first glass layer 26 can remain on the surfaces of the first portion 12, indefinitely, or it can be removed at a later step in the method. The first glass layer 26 can be partially removed such that the first glass layer 26 remains on the top surface of the dielectric layer 22 of the first portion 12. FIG. 6 illustrates the n-doped sub-fin (PTS) 25.

Figures 7A, 7B:
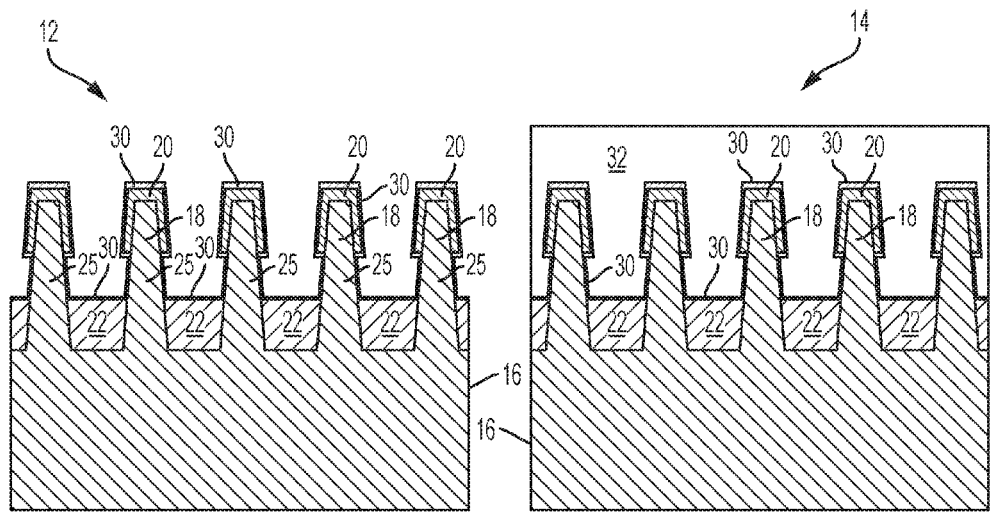
FIG. 7A is a cross-sectional view of the first portion illustrating deposition of a second conformal glass layer of opposite dopant polarity according to an embodiment.
FIG. 7B is a cross-sectional view of the second portion illustrating deposition of the second doped glass layer and deposition of a second blocking agent according to an embodiment.

FIG. 7A is a cross-sectional view of the first portion 12 (pFET device) illustrating deposition of a second glass layer 30 on the first portion 12. The second glass layer used in the example of FIG. 7A is Boron doped glass (Borosilicate Glass—BSG). Specifically, the second glass layer 30 is deposited on the surfaces of the masking layer 20, the PTS junction regions 24, and the dielectric layer 22 of the first portion 12. The second glass layer 30 can be deposited on both the first portion 12 (pFET device) and second portion 14 (nFET device) at the same time.

FIG. 7B is a cross-sectional view of the second portion 14 (nFET device) illustrating deposition of the second doped glass layer 30 (BSG) including a second doping agent (B). Specifically, the second glass layer 30 is deposited on the surfaces of the masking layer 20, the PTS regions 24, and the dielectric layer 22 of the second portion 14. The second glass layer 30 can have a thickness of 1 nm to 10 nm. The second glass layer 30 may be formed using known deposition techniques, such as chemical vapor deposition. The second glass layer 30 can be a thin film layer including a first doping agent, such as a solid state doping (SSD) doping layer, which can be deposited by plasma-enhanced atomic layer deposition (PEALD) type processes. The second glass layer 30 can be borosilicate glass (BSG) wherein the second doping agent is boron. The Borosilicate glass is deposited by Thermal or PEALD where sequential, layer by layer deposition of $B_2O_3$ and $SiO_2$ is achieved by alternately flowing Boron containing precursor and Silicon containing precursor. The oxidation of each species (B and Si) is obtained through plasma $O_2$ step during each cycle. Boron precursors that can be used include but not limited Tri-Ethyl Boron (TEB) or Tri-Methyl Boron (TMB). Boron concentration in the Glass layer is tuned by controlling the ratio of $B_2O_3$ cycle to $SiO_2$ cycle. The thickness and B concentration range in the BSG film are 1 nm-10 nm and $5e19$ atoms/$cm^3$-$1e21$ atoms/$cm^3$. Of course, the second glass layer 30 is not limited to glass, for example, the second glass layer 30 could be applied by a monolayer doping process, wherein the second glass layer 30 could be a monolayer of allylboronic acid pinacol ester, wherein boron is the second doping agent. The second glass layer 30 could also be a monolayer of diethyl 1-propylphosphonate, wherein the second doping agent is phosphorus. The second glass layer 30 can be an arsenic precursor wherein the second doping agent is arsenic.

FIG. 7B also illustrates masking of the nFET regions to protect the second glass layer (BSG) on the second portion 14 (nFET devices). The removal of second glass layer 30 from the first portion 12 (pFET devices) is achieved using wet HF or anhydrous HF chemistries.

After deposition of the second glass layer 30 on both the first portion 12 (pFET device) and second portion 14 (nFET device), the second portion 14 (nFET device) can be blocked by a second blocking agent 32. In an example, the second blocking agent 32 can include photoresist or a combination of Organic Planarizing Layer and Photoresist The second portion 14 is blocked in order to remove the second glass layer 30 (BSG) from the first portion 12 (pFET devices), without removing the second glass layer 30 from the second portion 14 (nFET devices).

Figures 8, 9:
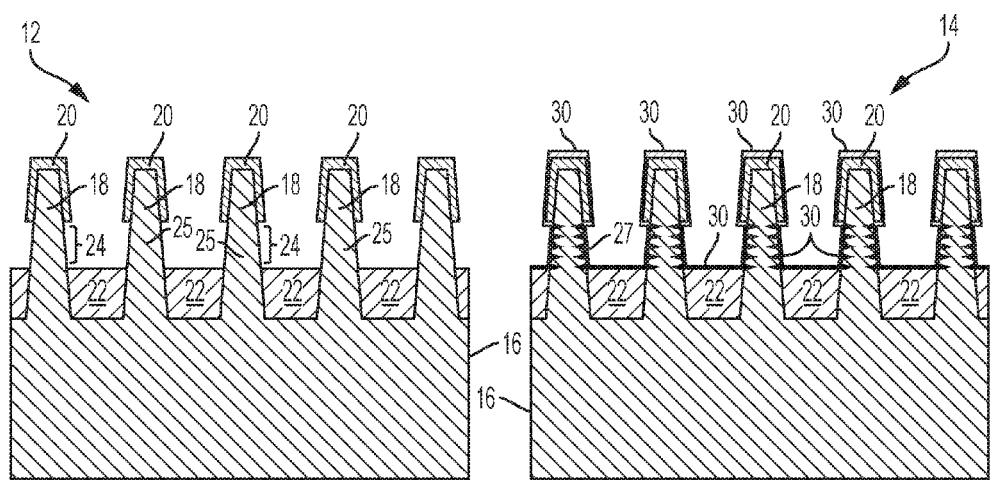

FIG. 8 illustrates the removal of the second glass layer 30 (BSG) from the first portion 12 (pFET devices), specifically from the exposed surfaces of the masking layer 20, the PTS regions 24, and the dielectric layer 22 of the first portion 12.

FIG. 9 illustrates annealing the second glass layer 30 on the second portion 14 (nFET devices), specifically doping the PTS junction regions 24 with the second doping agent (BSG). After diffusion annealing the second portion 14, the residual second glass layer 30 (BSG) can be removed from the second portion 14, specifically from the surfaces of the masking layer 20, the PTS junction regions 24, and the dielectric layer 22. The removal of the second glass layer 30 is, however, optional. The second glass layer 30 can be partially removed such that the second glass layer 30 remains on the top surface of the dielectric layer 22 of the second portion 14. FIG. 9 illustrates the p-doped section 27.

Figure 10A:
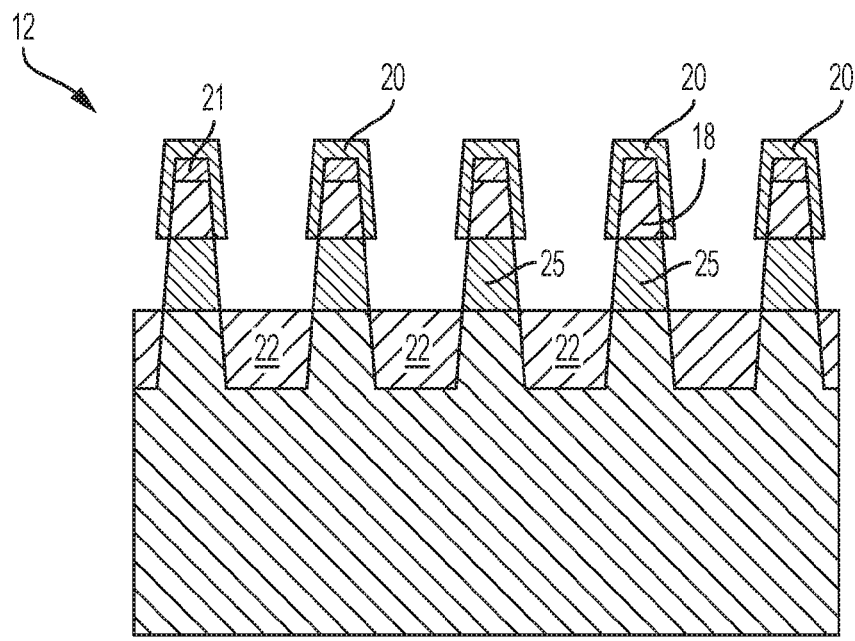
FIG. 10A shows the first type of device with the first type of doping in the sub-fin region
Figure 10B:
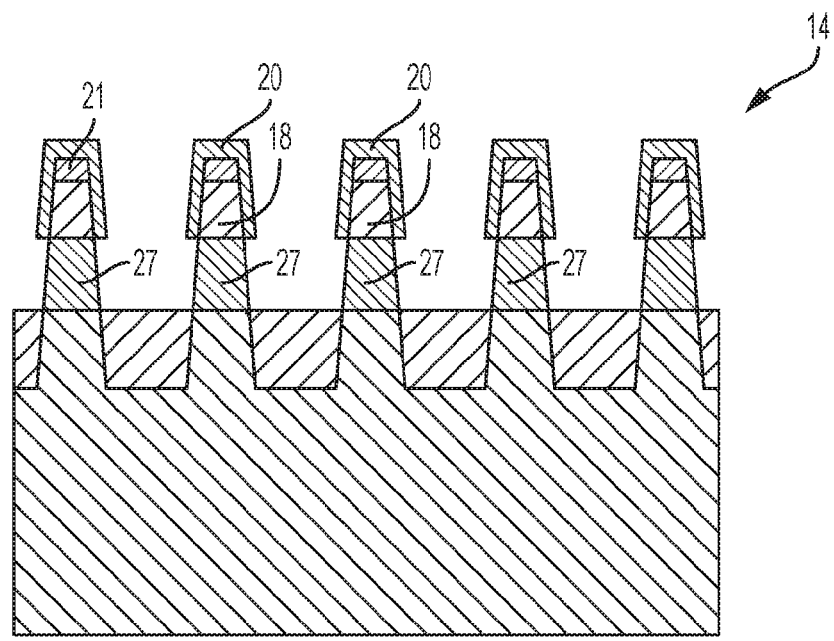
FIG. 10B shows the second type of device with the second type of doping in the sub-fin region.

FIGS. 10A-10B illustrate first portion 12 (pFET devices) and second portion 14 (nFET devices) showing PTS junction formation just below the active fin regions. Thus, portion 12 (pFET devices) have Phosphorus atoms for the PTS junction 25, whereas the portion 14 (nFET devices) have Boron atoms for the PTS junction 27. These dopant atoms were thermally driven into the PTS region via Solid State Diffusion from the doped glass.

Figure 11A:
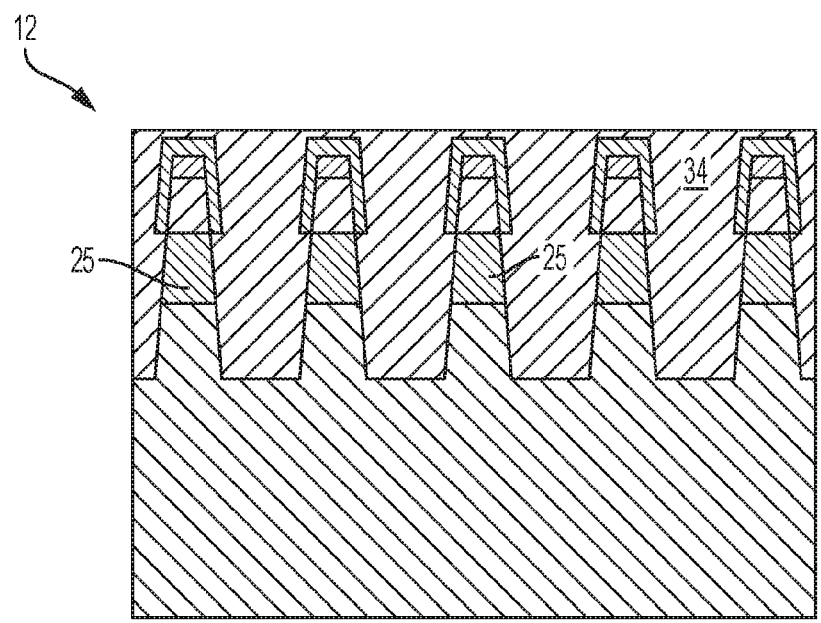
FIG. 11A is a cross-sectional view of the first portion illustrating deposition of a second dielectric layer according to an embodiment.
Figure 11B:
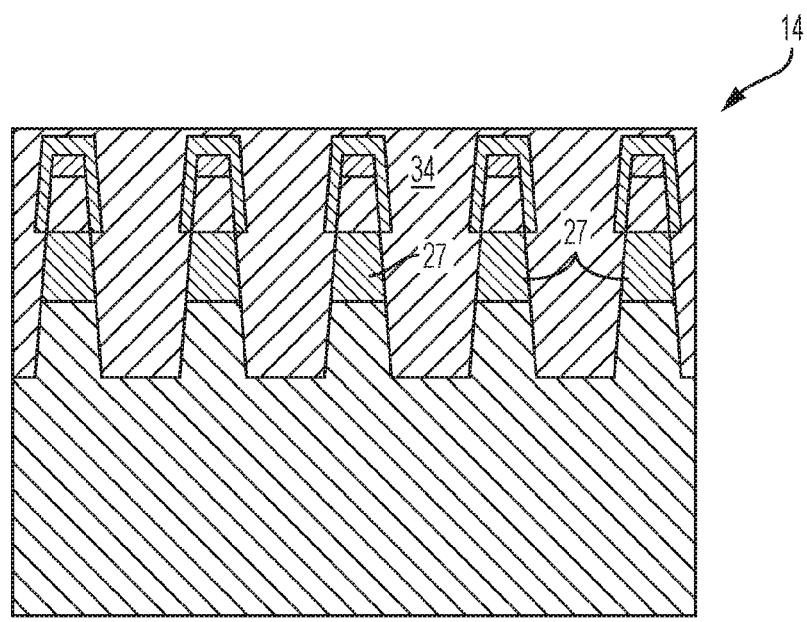
FIG. 11B is a cross-sectional view of the second portion illustrating removal of the second glass layer and deposition of the second dielectric layer and CMP planarizing according to an embodiment.

FIGS. 11A-11B illustrate deposition of a second dielectric layer 34. The second dielectric layer 34 may be the same or different than the first dielectric layer 22. The second dielectric layer 34 can be deposited and planarized (CMP) such that the top surface of the second dielectric layer 34 is level with the top surface of the capped top portion of the fins 18. In other words, the second dielectric layer 34 can fill the gaps between the fins 18.

Figure 12A:
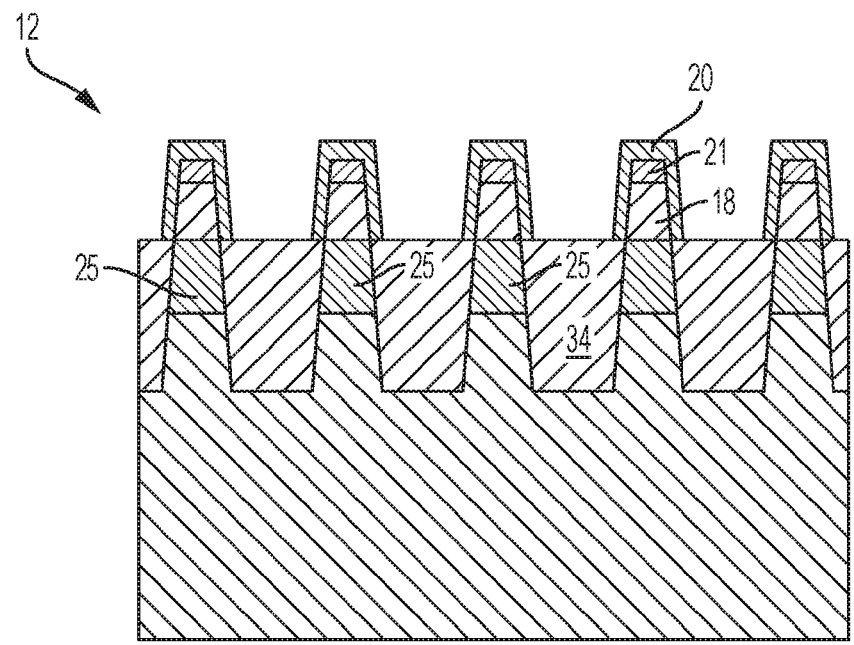
FIG. 12A is a cross-sectional view of the first portion illustrating recessing of the second dielectric layer to expose the capped portion of the fins according to an embodiment.
Figure 12B:
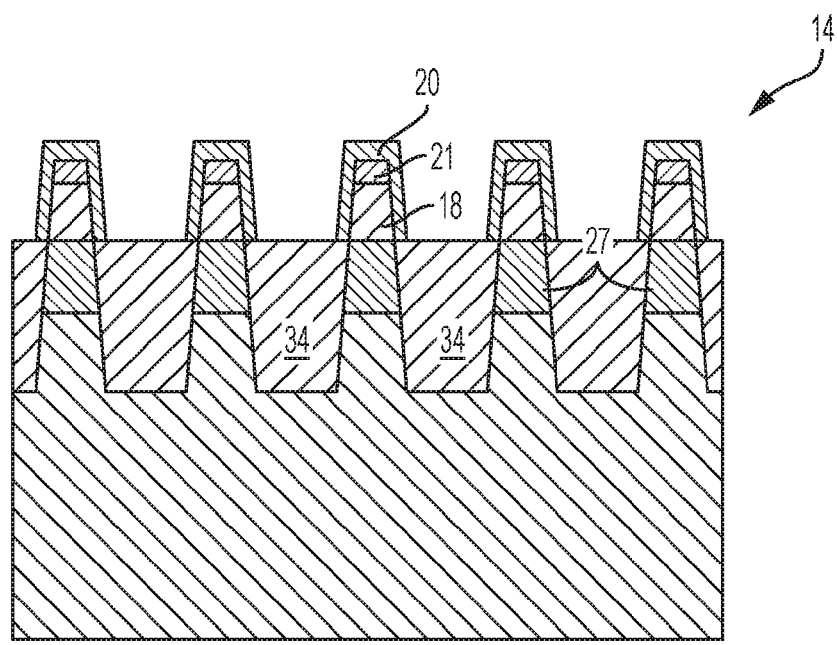
FIG. 12B is a cross-sectional view of the second portion illustrating recessing of the second dielectric layer to expose the capped portion of the fins according to an embodiment.
Figure 13A:
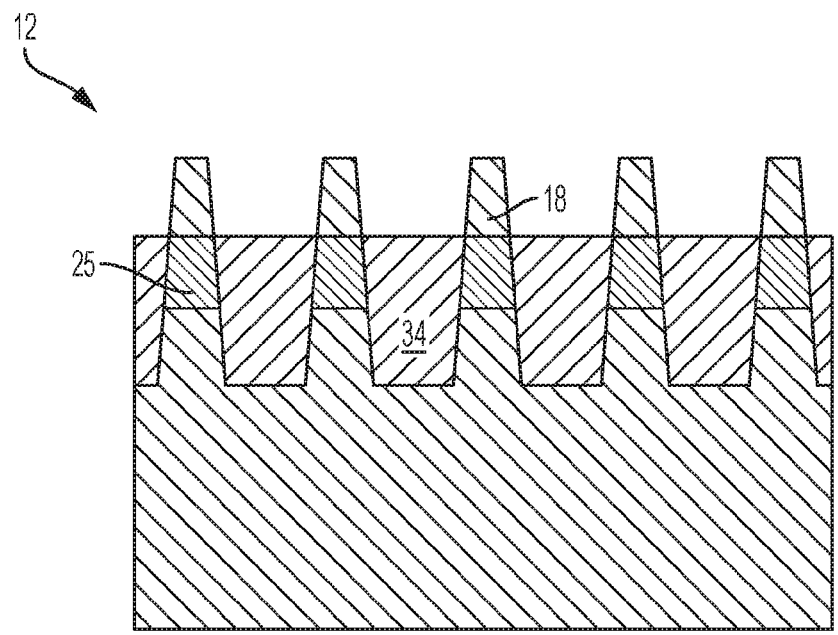
FIG. 13A is a cross-sectional view of the first portion illustrating removal of the masked layer(s) of the fins according to an embodiment.
Figure 13B:
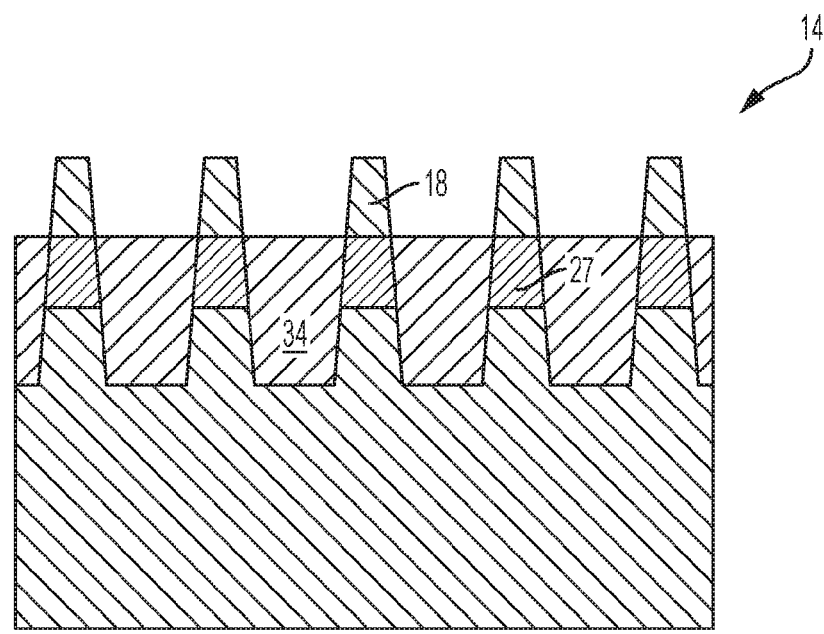

FIGS. 12A-12B illustrate a recessing of the second dielectric layer 34 to expose the masking layer 19 and 20 surrounding the active fins 18. The recess can be performed by RIE or any other suitable wet etch method. FIGS. 13A-13B illustrate the removal of the masking layers 19 (Oxide/Nitride) and 20 (fin hardmask—SiN) surrounding the active fins 18. The result of the method results in a first portion 12 that includes fins 18 doped with a first doping agent (Phosphorus), and a second portion 14 that includes fins 18 doped with a second doping agent (Boron).

FIGS. 14A through 19B illustrate another exemplary fabrication process of forming the semiconductor device 10 according to an embodiment.

Figure 14A:
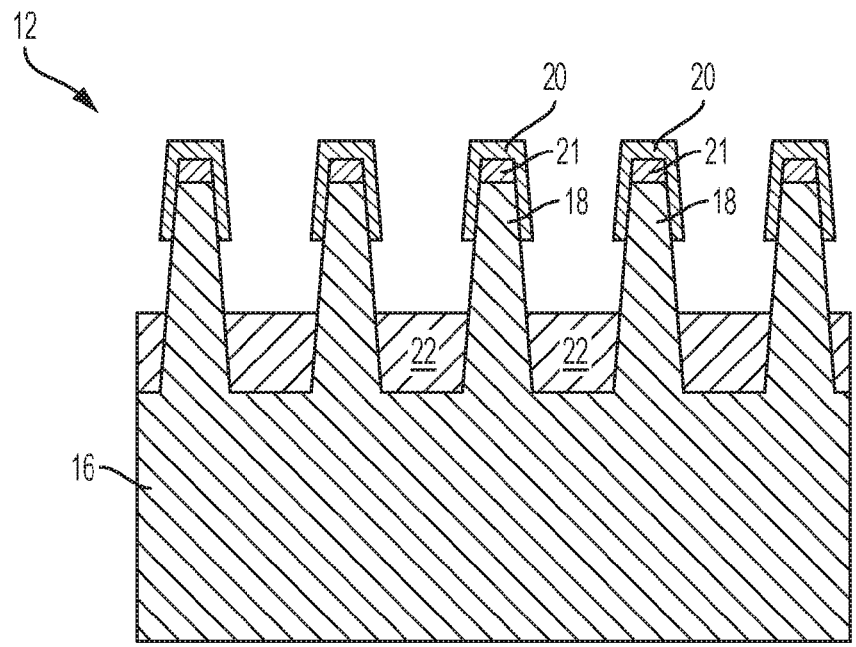
Figure 14B:
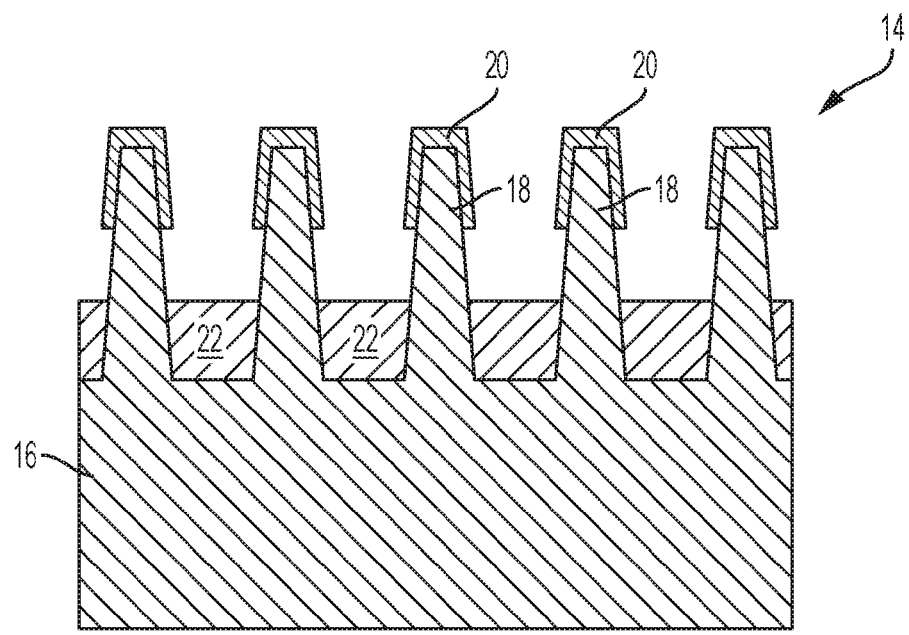
FIG. 14B is a cross-sectional view of the first and/or second portion illustrating recessing the dielectric oxide layer to expose the sub-fin (PTS junction) region under each of the capped fins for doping according to an embodiment.

FIGS. 14A and 14B illustrate the first portion 12 and/or second portion 14 including a dielectric layer 22 on the substrate 16 and capped top portions of the fins 18. FIG. 15 illustrates recessing the dielectric layer 22 to expose the PTS junction region 24 under each of the capped top portion of the fins 18.

Figure 15A:
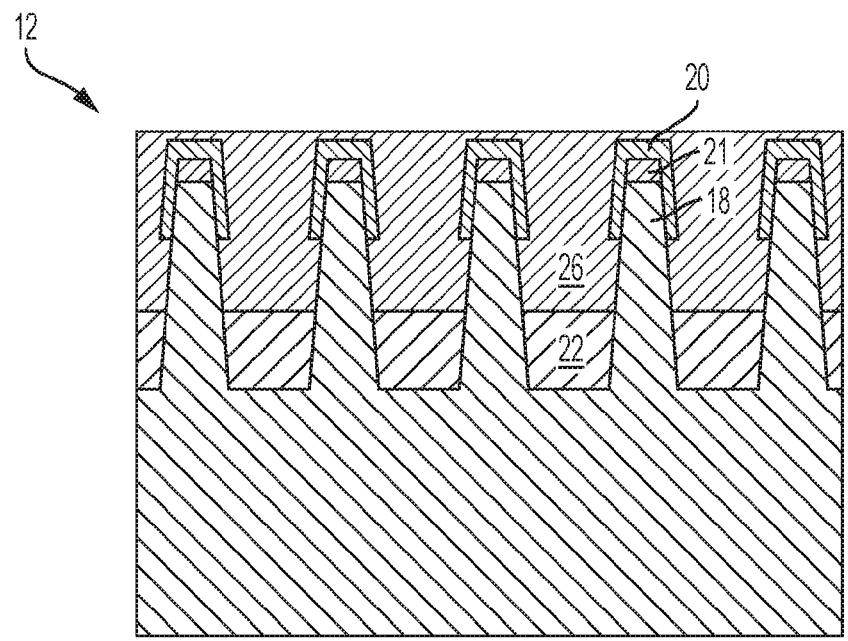
FIG. 15A is a cross-sectional view of the first portion illustrating depositing of a first doped glass layer on the first portion to completely fill the trench space according to an embodiment.
Figure 15B:
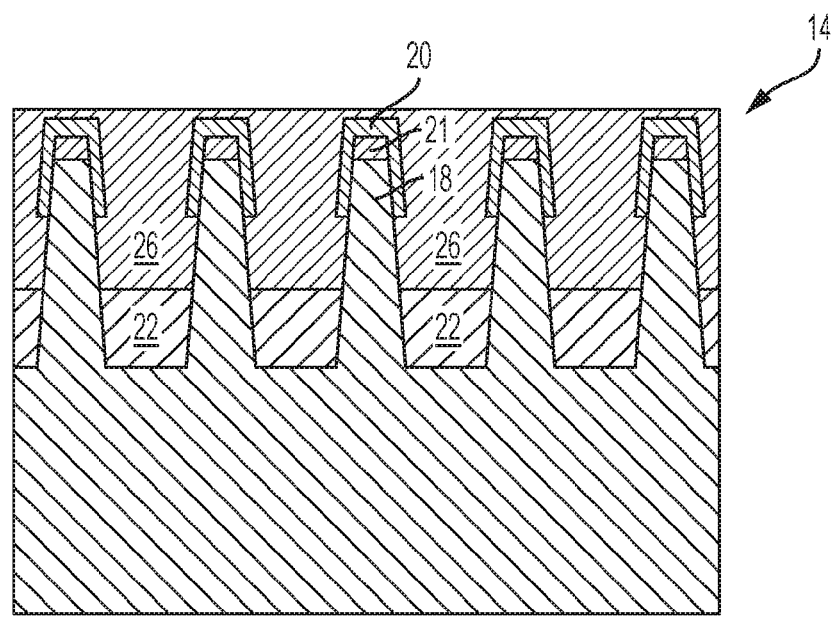
FIG. 15B is a cross-sectional view of the second portion illustrating depositing of a first glass layer on the second portion to completely fill the trench space according to an embodiment.

FIGS. 15A-15B illustrate depositing of a first glass layer 26 (Phosphosilicate Glass), wherein the first glass layer 26 is deposited to fill the space between the fins 18. The first glass layer 26 can be deposited and planarized such that a top surface of the first glass layer 26 is approximately level with that of the capped top portions (fin hard mask) of the fins 18.

Figure 16A:
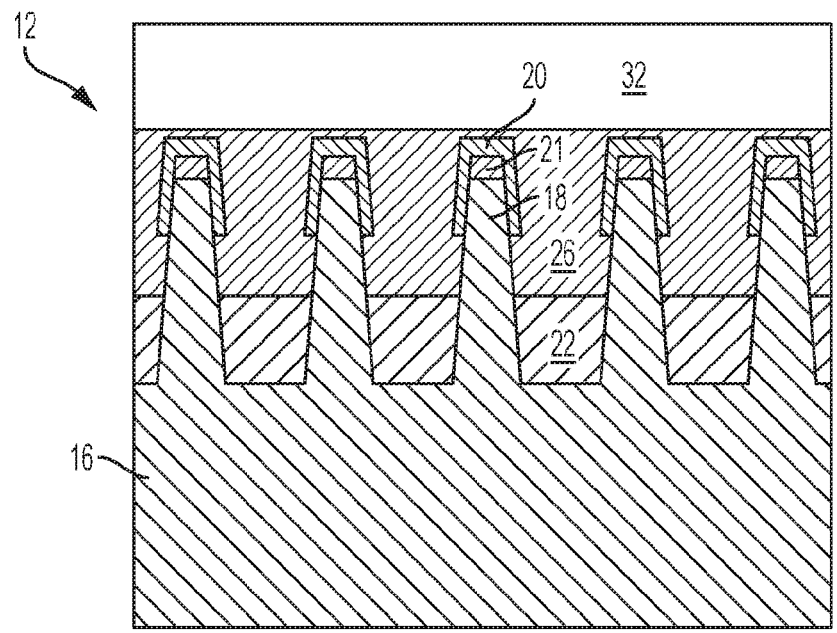
FIG. 16A is a cross-sectional view of the first portion illustrating blocking the first portion with a first blocking agent according to an embodiment.
Figure 16B:
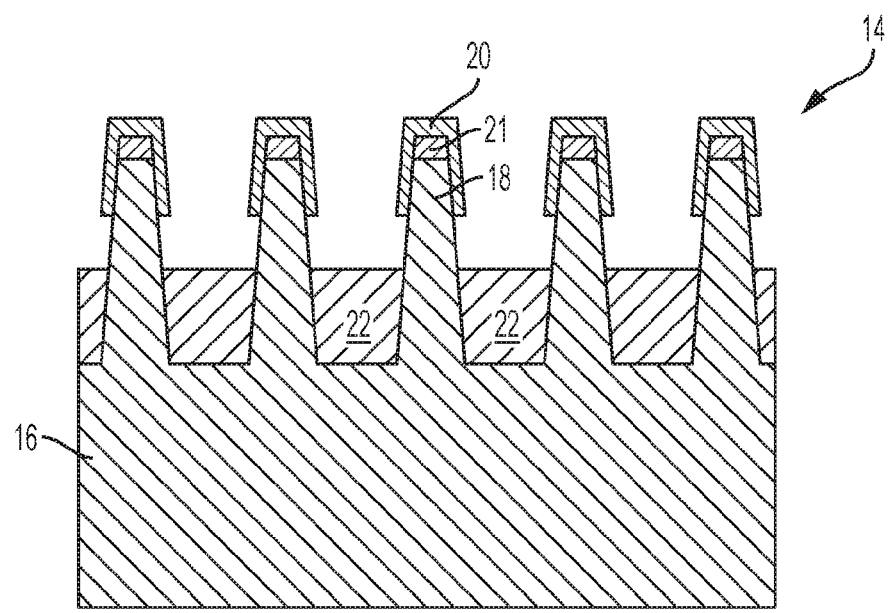
FIG. 16B is a cross-sectional view of the second portion illustrating removal of the first doped glass layer according to an embodiment.

FIG. 16A illustrates blocking the first portion 12 (pFET devices) with a first blocking agent 32 (Organic Planarizing layer and photoresist). As shown in FIG. 16B, while the first portion 12 is blocked, protecting the first glass layer 32 on the first portion (pFET devices) 12, the first glass layer 26 (Phosphosilicate Glass) on the second portion 14 (nFET devices) can be removed selective to layer 22 (undoped SiO2).

Figure 17A:
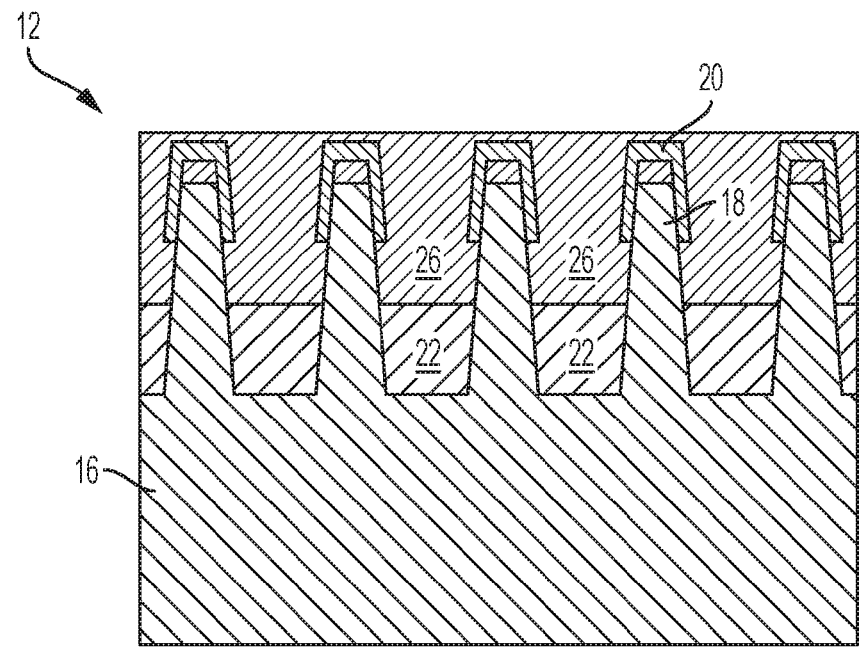
FIG. 17A is a cross-sectional view of the first portion illustrating removal of the blocking agent from the first portion according to an embodiment.
Figure 17B:
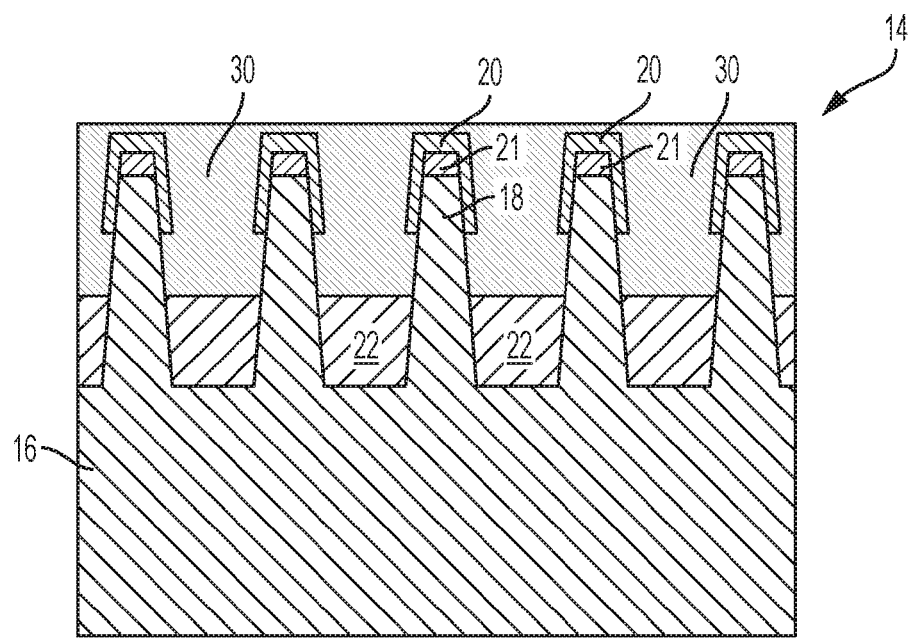
FIG. 17B is a cross-sectional view of the second portion illustrating deposition and planarization of a second glass layer containing dopant of opposite polarity from the first type according to another embodiment.

FIG. 17B illustrates the deposition of the second glass layer 30 (Borosilicate Glass). The deposition can be such to fill the space between the fins 18 on the second portion 14. In an example, a top surface of the second glass layer 30 can be approximately leveled with that of the top surface of the capped top portions of the fins 18 using Chemical Mechanical Planarization (CMP). As shown in FIG. 17A, the first blocking layer 32 can be removed from the first portion 32 during the CMP.

Figure 18A:
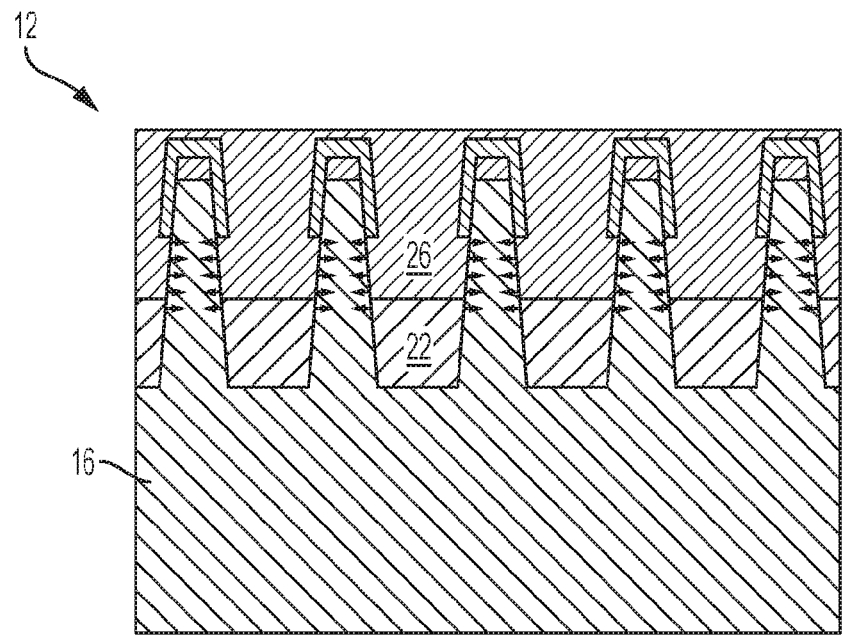
FIG. 18A is a cross-sectional view of the first portion illustrating annealing the first glass layer according to an embodiment.
Figure 18B:
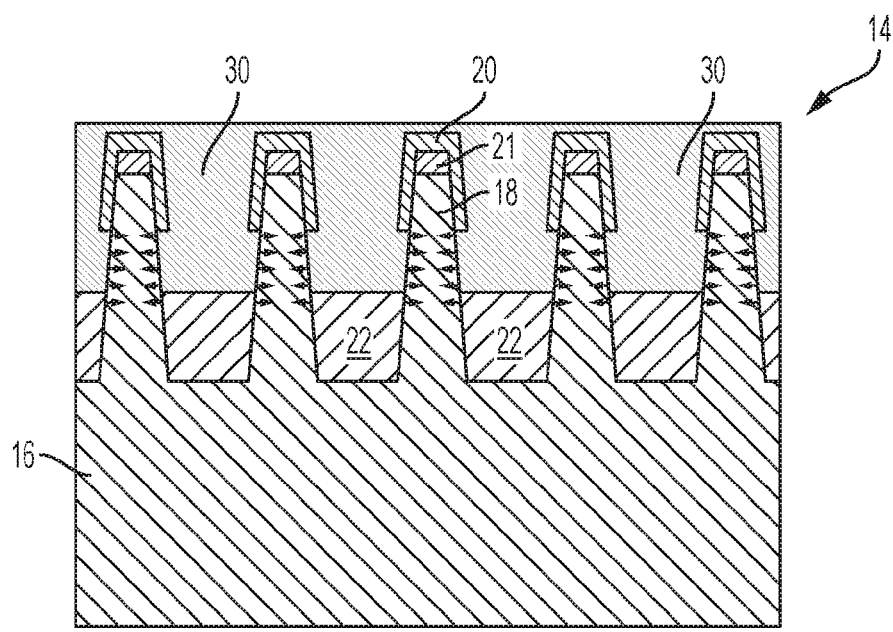

FIGS. 18A-18B illustrate simultaneous annealing of the first glass layer 26 (PSG) on the first portion 12 (pFET devices) and annealing the second glass layer 30 (BSG) on the second portion 14 (nFET devices) to drive respective dopants into the sub-fin regions of the two types of devices. As a result, the fins 18 on the first portion 12 are doped with the first doping agent, and the fins 18 on the second portion 14 are doped with the second doping agent.

Figure 19A:
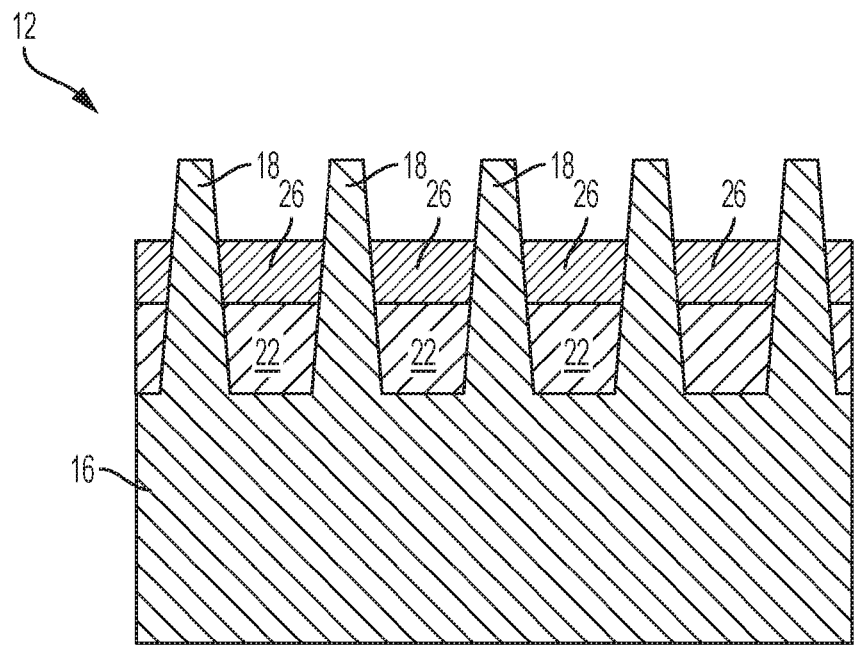
FIG. 19A is a cross-sectional view of the first portion illustrating recession of the first glass layer to expose the capped portion of the fins according to an embodiment.
Figure 19B:
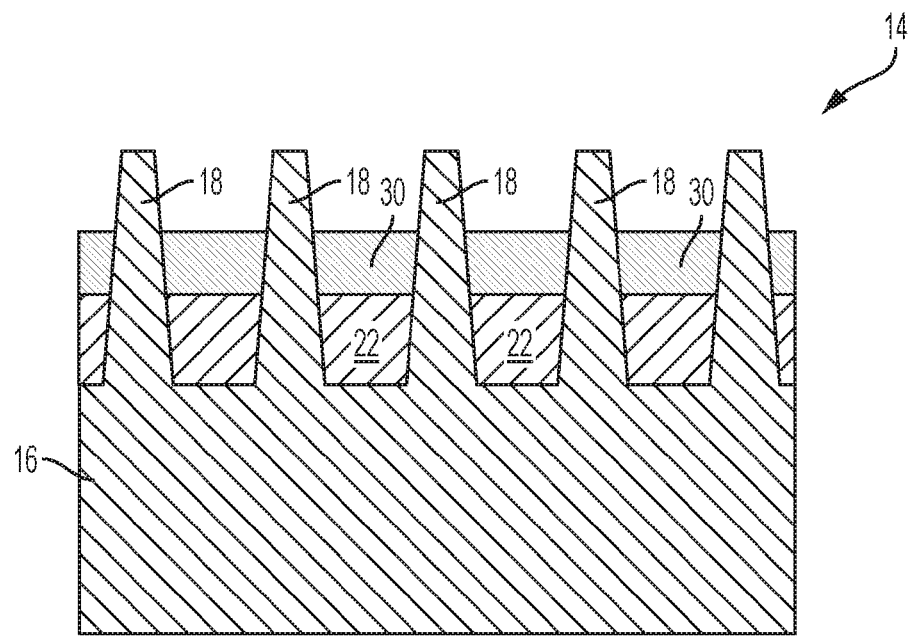
FIG. 19B is a cross-sectional view of the second portion illustrating recession of the second glass layer to expose and remove the capped portion of the fins according to an embodiment.

FIGS. 19A-19B illustrate recessing the first glass layer 26 and the second glass layer 30 such that the FIN hard mask layer 20 and masking layer 19 surrounding the fins 18 are exposed. In other words, the first glass layer 26 and the second glass layer 30 are removed from the surface of the layers 19 and 20. In an example, the entirety of the first glass layer 26 and second glass layer 30 can be removed from the first portion 12 and second portion 14, respectively. In such example, a second dielectric layer 34 can be deposited and subsequently recessed, such that the top surface of the recessed second dielectric layer 34 is below the capped top portions of the fins 18. In either case, after recession of the first glass layer 26 and second glass layer 30, or recession of the second dielectric layer 34, the masking layer 20 of the top portions of the fins 18 can be removed, as shown in FIGS. 19A-19B.

Figure 20A:
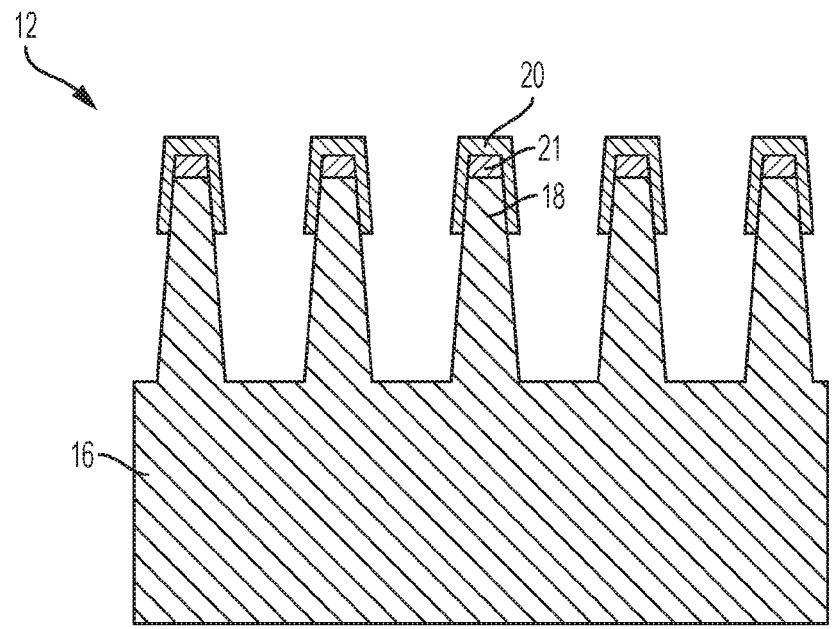
Figure 20B:
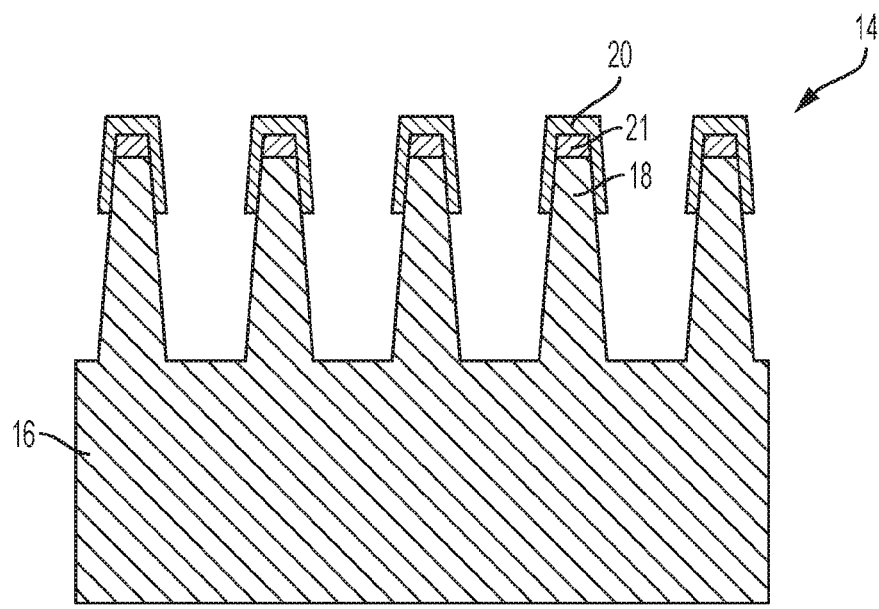
FIG. 20B is a cross-sectional view of the second portion post-sub-fin doping where the dielectric layer between the fins is completely removed post-drive in anneal according to an embodiment.
Figure 21A:
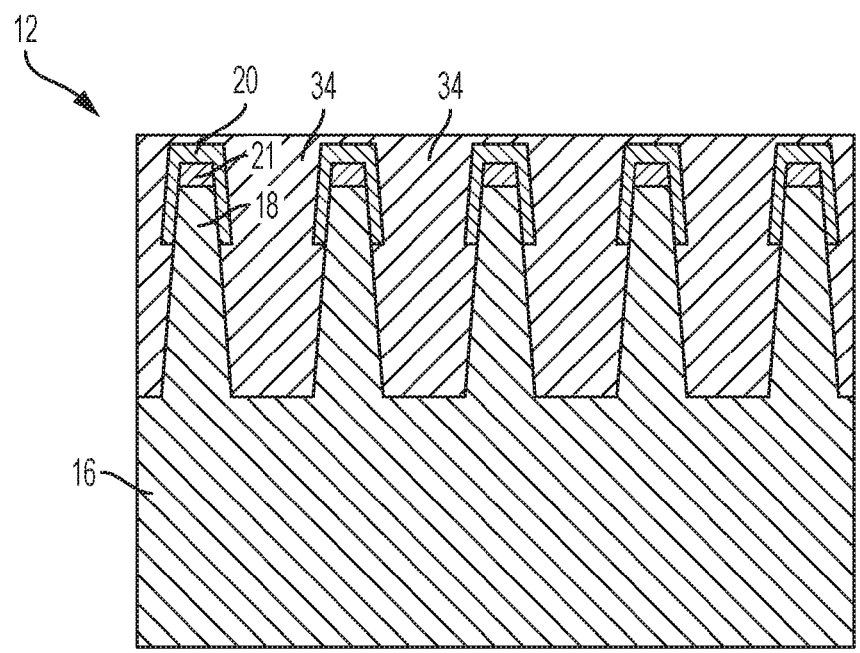
FIG. 21A is a cross-sectional view of the first portion where a new dielectric layer is redeposited, densified and planarized according to an embodiment.
Figure 21B:
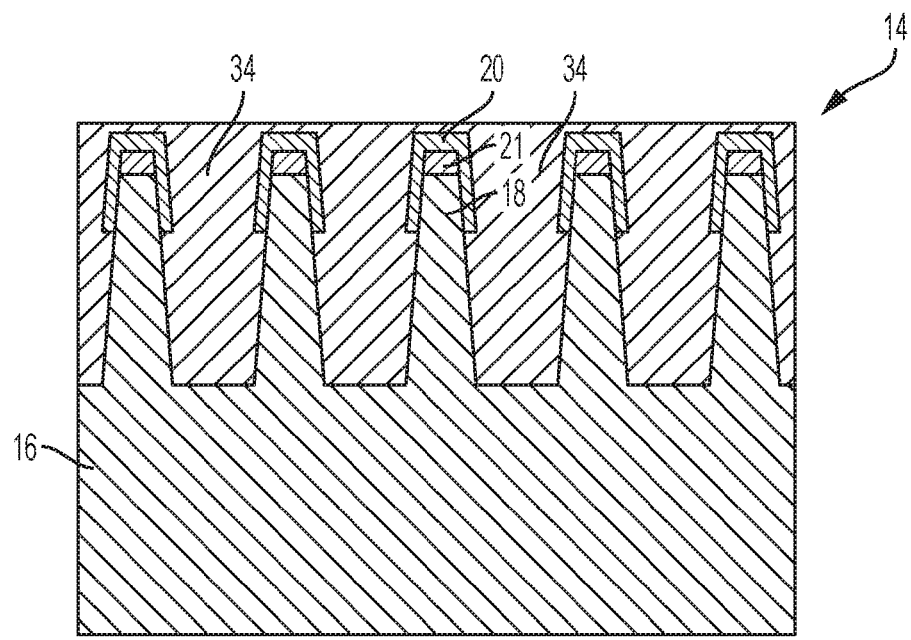
FIG. 21B is a cross-sectional view of the second portion where a new dielectric layer is redeposited, densified and planarized according to embodiment

In yet another variation, after the simultaneous annealing of the first glass layer 26 on the first portion 12 and the second glass layer 30 on the second portion 14, as shown in FIGS. 20A-20B, both the first glass layer 26, the second glass layer, and the dielectric layer 22 are completely removed from the substrate 16 on both the first portion 12 and second portion 14. Then, as shown in FIGS. 21A and 21B, a second dielectric layer 34 (undoped $SiO_2$) may be deposited on the substrate surface, filling the space between the fins 18, and planarized such that the top surface of second dielectric layer 34 is approximately level with that of the capped top portions of the fins 18 on both the first portion 12 and second portion 14. The second dielectric layer 34 can then be recessed to expose the masked layer 20 of the fins, as shown in FIG. 10A-10B.

Figure 22A:
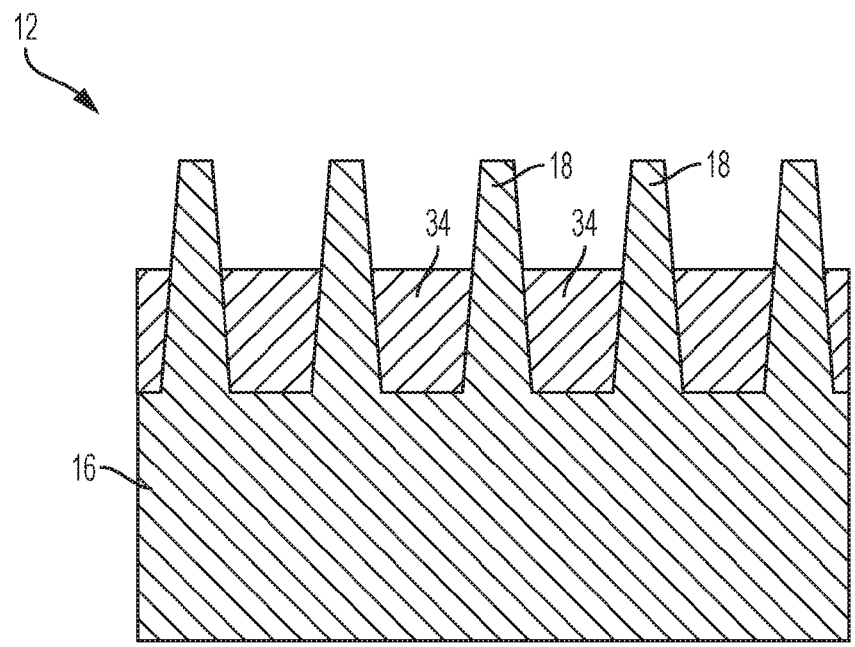
FIG. 22A is a cross-sectional view of the first portion where a new dielectric layer is recessed to expose the capped portion of the FIN and cap removed according to an embodiment.
Figure 22B:
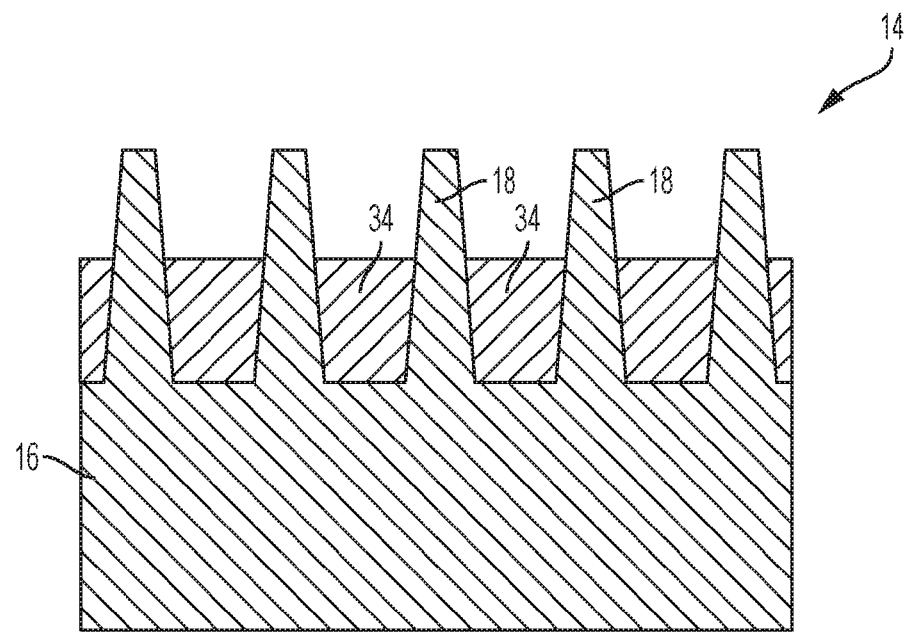

Finally, the masked layer 20 of the fins 18 can be removed, as shown in FIGS. 22A-22B. FIG. 22A is a cross-sectional view of the first portion where a new dielectric layer is recessed to expose the capped portion of the FIN and cap removed according to an embodiment. FIG. 22B is a cross-sectional view of the second portion where a new dielectric layer is recessed to expose the capped portion of the FIN and cap removed according to an embodiment.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
   forming a first fin on a substrate;
   depositing an insulator layer on the substrate adjacent to the first fin;
   removing a first portion of the insulator layer to expose a first portion of a sidewall of the first fin;
   depositing a layer of spacer material over the first portion of the sidewall of the first fin;
   removing a second portion of the insulator layer to expose a second portion of the sidewall of the first fin;
   depositing a first glass layer including a first doping agent over the exposed second portion of the sidewall of the first fin; and
   performing a first annealing process to drive the first doping agent into the first fin.

2. The method of claim 1, further comprising;
   forming a second fin on the substrate when forming the first fin;
   exposing a first portion of a sidewall of the second fin when removing the first portion of the insulator layer;
   depositing the layer of spacer material over the first portion of the sidewall of the second fin;
   removing the second portion of the insulator to expose a second portion of the sidewall of the second fin;
   depositing the first glass layer over the exposed second portion of the sidewall of the second fin;
   patterning a mask over the first fin prior to performing the first annealing process; and
   removing exposed portions of the first glass layer from the second portion of the sidewall of the second fin prior to performing the first annealing process.

3. The method of claim 2, further comprising:
   after the first annealing process, depositing a second glass layer including a second doping agent over an exposed second portion of the sidewall of the first fin and an exposed second portion of the sidewall of the second fin;
   patterning a mask over the second fin;
   removing exposed portions of the second glass layer from the second portion of the sidewall of the first fin; and
   performing a second annealing process to drive the second doping agent into the second fin.

4. The method of claim 1, wherein the first glass layer includes a phosphosilicate glass layer.

5. The method of claim 1, wherein the first glass layer is a borosilicate glass.

6. The method of claim 1, wherein the first glass layer is a monolayer deposition of a boron precursor.

7. The method of claim 1, wherein the first doping agent is arsenic.

8. The method of claim 1, wherein the mask includes SiN.

9. The method of claim 2, wherein the first glass layer is dissimilar from the second glass layer.

10. A method of forming a semiconductor device, the method comprising:
    forming a first fin on a substrate;
    depositing an insulator layer on the substrate adjacent to the first fin;
    depositing a layer of spacer material over a first portion of a sidewall of the first fin;
    removing a first portion of the insulator layer to expose a second portion of a sidewall of the first fin;
    depositing a first glass layer including a first doping agent over the insulator layer and the exposed second portion of the sidewall of the first fin; and
    performing an annealing process to drive the first doping agent into the first fin.

11. The method of claim 10, further comprising: forming a second fin on the substrate when forming the first fin; depositing the layer of spacer material over a first portion of a sidewall of the second fin; removing the first portion of the insulator layer to expose a second portion of a sidewall of the second fin; depositing the first glass layer including the first doping agent over the insulator layer and the exposed second portion of the sidewall of the second fin.

12. The method of claim 11, further comprising:
    patterning a mask over the first fin prior to performing the annealing process;
    removing exposed portions of the first glass layer from the second portion of the sidewall of the second fin prior to performing the annealing process; and
    depositing a second glass layer including a second doping agent over the insulator layer and the exposed second portion of the sidewall of the second fin prior to performing the annealing process.

13. The method of claim 12, further comprising removing portions of the first glass layer and the second glass layer to expose the spacer material on sidewalls of the first fin and the second fin.

14. The method of claim 10, wherein the first glass layer is a phosphosilicate glass layer.

15. The method of claim 10, wherein the first glass layer is borosilicate glass.

16. The method of claim 10, wherein the first glass layer is a monolayer deposition of a boron precursor.

17. The method of claim 11, wherein the first glass layer is dissimilar from the second glass layer.

* * * * *